(12) United States Patent
Chiang et al.

(10) Patent No.: US 11,915,736 B2
(45) Date of Patent: Feb. 27, 2024

(54) FERROELECTRIC MEMORY OPERATION BIAS AND POWER DOMAINS

(71) Applicant: Taiwan Semiconductor Manufacturing Company, Ltd., Hsinchu (TW)

(72) Inventors: Katherine H. Chiang, New Taipei (TW); Chung-Te Lin, Tainan (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/696,552

(22) Filed: Mar. 16, 2022

(65) Prior Publication Data

US 2023/0134802 A1 May 4, 2023

Related U.S. Application Data

(60) Provisional application No. 63/275,754, filed on Nov. 4, 2021.

(51) Int. Cl.
*G11C 11/22* (2006.01)
*H10B 51/20* (2023.01)
*H10B 51/30* (2023.01)

(52) U.S. Cl.
CPC ........ *G11C 11/2275* (2013.01); *G11C 11/223* (2013.01); *G11C 11/2255* (2013.01);
(Continued)

(58) Field of Classification Search
CPC .............. G11C 11/2275; G11C 11/223; G11C 11/2257
See application file for complete search history.

(56) References Cited

U.S. PATENT DOCUMENTS

| 6,339,238 B1 | 1/2002 | Lim et al. |
| 2008/0025105 A1* | 1/2008 | Kang ...................... G11C 11/22 365/185.25 |

(Continued)

FOREIGN PATENT DOCUMENTS

TW    202010102 A    3/2020

OTHER PUBLICATIONS

Wong, et al., "A comparative study of charge pumping circuits for flash memory applications," Microelectronics Reliability, vol. 52, Issue 4, pp. 670-687, Apr. 2012.

*Primary Examiner* — Han Yang
(74) *Attorney, Agent, or Firm* — MERCHANT & GOULD P.C.

(57) ABSTRACT

A memory system including a plurality of memory cells, a plurality of word lines, a plurality of bit lines, and a plurality of source lines. The plurality of memory cells are arranged in rows and columns, each of the plurality of memory cells having a gate, a drain, and a source. In the plurality of word lines, each of the word lines having a corresponding row, wherein each of the word lines is coupled to the gates of the memory cells in the corresponding row. In the plurality of bit lines and the plurality of source lines, each of the bit lines and each of the source lines having a corresponding column, where each of the bit lines is connected to the drain of the memory cells in the corresponding column and each of the source lines is connected to the source of the memory cells in the corresponding column. Where, in a write operation, the word line corresponding to a selected memory cell is configured to receive a first voltage, and the bit line and the source line of the selected memory cell are configured to receive a second voltage, and where one of the first voltage or the second voltage is a positive voltage and the other of the first voltage or the second voltage is a negative voltage.

20 Claims, 10 Drawing Sheets

(52) U.S. Cl.
CPC ...... *G11C 11/2257* (2013.01); *G11C 11/2273* (2013.01); *G11C 11/2297* (2013.01); *H10B 51/20* (2023.02); *H10B 51/30* (2023.02)

(56) References Cited

U.S. PATENT DOCUMENTS

| | | | |
|---|---|---|---|
| 2012/0134197 A1* | 5/2012 | Byun | G11C 11/22 |
| | | | 365/145 |
| 2018/0040379 A1* | 2/2018 | Sonoda | G11C 16/0466 |
| 2021/0074726 A1* | 3/2021 | Lue | H10B 51/30 |

* cited by examiner

FERROELECTRIC MEMORY OPERATION BIAS AND POWER DOMAINS

CROSS-REFERENCE TO RELATED APPLICATIONS

This application claims the benefit of U.S. Provisional Patent Application No. 63/275,754, filed on Nov. 4, 2021, the disclosure of which is incorporated by reference in its entirety.

BACKGROUND

A ferroelectric field-effect transistor (FeFET) is a type of field-effect transistor that includes a ferroelectric material sandwiched between the gate electrode and the source-drain conduction region of the device. Permanent electrical field polarization in the ferroelectric material causes this type of device to retain the transistor's state (biased on or biased off) in the absence of power. FeFET based devices are used in FeFET memory, such as FeRAM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

DETAILED DESCRIPTION

Figure 1:
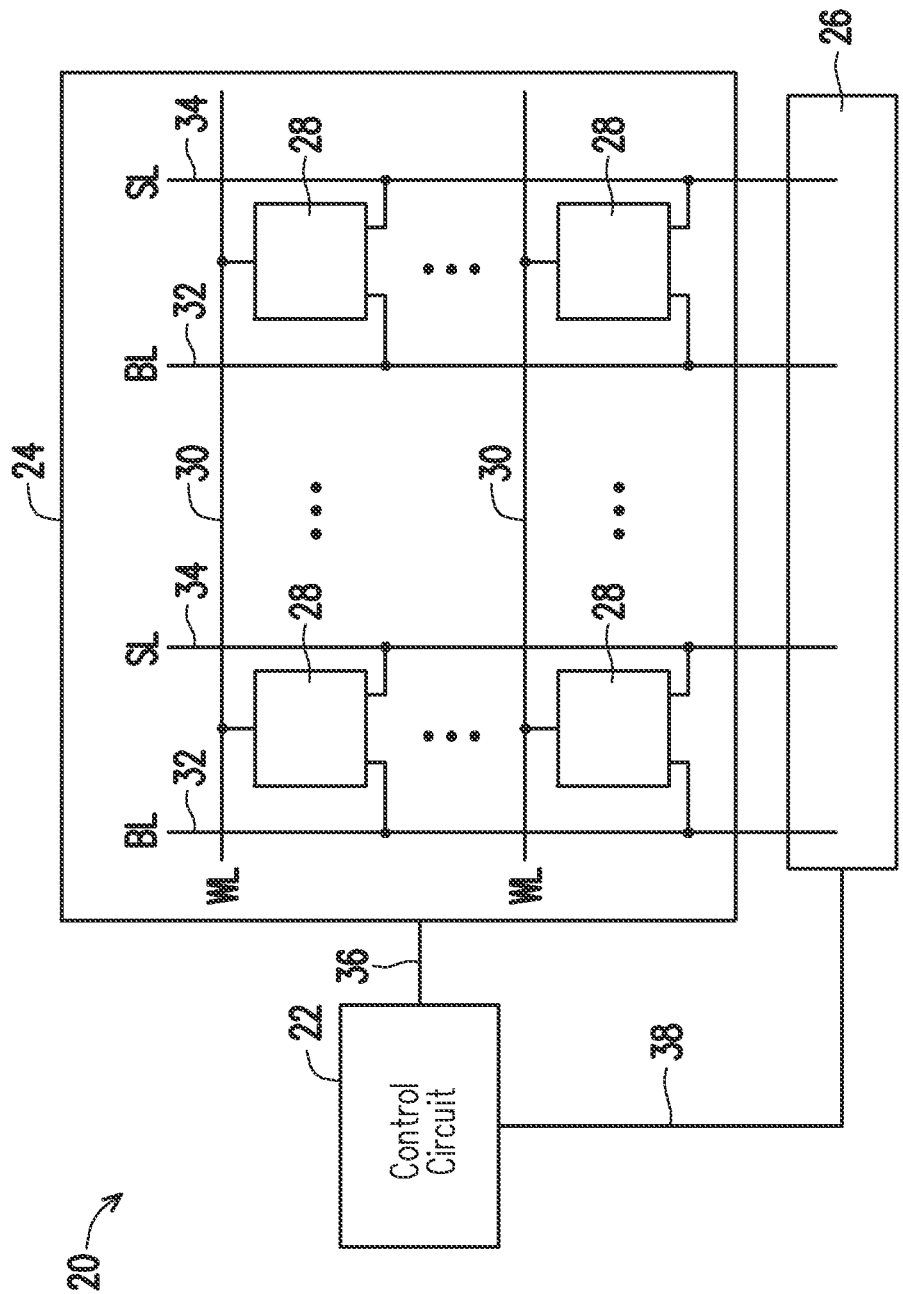
FIG. 1 is a diagram schematically illustrating a memory circuit that includes a control circuit, a memory array, and I/O circuits, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, memory circuits include two types of voltage/current biasing. One type of biasing is for realizing memory cell operations, such as read and write operations, and the other type of biasing is for reading data out of the memory cells and providing an output data signal from the memory circuit and for logic operations and control signals. The bias for memory cell operations is based on satisfying a write/read fail rate and a disturb rate of half-selected cells, where the half-selected cells are memory cells that are not in the present read/write operation but have at least one of their control signals selected by the present read/write operation. The bias for reading data out of the memory cells and providing an output data signal is determined by the read-out and output circuit interface of the memory circuit.

In some memory circuits a large voltage bias is applied across memory cells for performing memory cell operations, such as write operations, and a smaller voltage bias is applied for reading data out of the memory cells. For example, in some ferroelectric memories, a large voltage bias is applied across the ferroelectric material to perform write operations, such as program operations and erase operations, in the memory cells. The ferroelectric memories are nonvolatile memories (NVMs). Also, other NVMs that rely on charge trapping may use a large voltage bias in write operations, such as program and erase operations, and a smaller voltage bias for reading the memory cells.

In some ferroelectric memory circuits, a positive voltage polarity, such as 2.4 V, is applied across the ferroelectric material to program a selected memory cell and a negative voltage polarity, such as −2.4 V, is applied across the ferroelectric material to erase the selected memory cell. For example, in one program operation, a positive 2.4 V is applied on the word line (WL) of the selected memory cell and 0 V is applied on the bit line (BL) and the source line (SL) of the selected memory cell. Also, a positive 1.2 V is applied on the BLs and the SLs of unselected memory cells to prevent them from being programmed. In an erase operation, a −2.4 V is applied on the word line (WL) of the selected memory cell and 0 V is applied on the BL and the SL of the selected memory cell and on the BLs and the SLs of the unselected memory cells to perform a word line erase. Thus, the memory circuit operates in a voltage range of from 2.4 V to −2.4 V and uses negative bias voltages during memory cell operations. This calls for I/O circuits that are compatible with the negative bias voltages. However, typical I/O circuits for digital logic domains operate with only positive voltages and manufacturing an I/O circuit that is compatible with the large voltage range for performing memory cell operations and the negative bias voltages consumes more area and is thus costly.

Disclosed embodiments use negative bias voltages for memory cell operations while maintaining interface compatibility with digital logic domain I/O circuits that operate with only positive voltages. Also, disclosed embodiments include memory circuits that distribute the voltage bias for performing memory cell operations across the ferroelectric material by having a positive or negative voltage on the WL and another positive or negative voltage on the BL and the SL of the selected memory cell, as opposed to applying one large positive or negative voltage on the WL and 0 V on the BL and SL of the selected memory cell. The voltage bias for performing memory cell operations is applied using voltage combinations on the WL, BL, and SL of the selected memory cell, which reduces the voltage range on the WL and the area consumed in the memory circuit for circuits, such as the I/O circuits.

Disclosed embodiments include a memory system that includes a plurality of memory cells and a control circuit configured to provide a first voltage to a selected word line and a second voltage to a selected bit line and/or to a selected source line in a write operation to a selected memory cell. The write operation can be a program operation or an erase operation, where one of the first voltage or the second voltage is a positive voltage and the other one of the first voltage or the second voltage is a negative voltage. In some embodiments, the write operation is performed on the selected memory cell with other WLs, BLs, and SLs set to 0 V. In some embodiments, the write operation is performed on a single, selected memory cell, such that the write operation is a bit-level random access write operation.

In some embodiments, in a program operation, 1.2 V is provided to a WL of a selected memory cell, −1.2 V is provided to a BL and a SL of the selected memory cell, and 0V is provided to other WLs, BLs, and SLs in the memory circuit, which results in a bit-level program operation. In some embodiments, in an erase operation, −1.2 V is provided to a WL of a selected memory cell, 1.2 V is provided to a BL and a SL of the selected memory cell, and 0 V is provided to other WLs, BLs, and SLs in the memory circuit, which results in a bit-level erase operation.

Disclosed embodiments include power separated into a first power domain for performing memory cell operations, such as read and write operations that include program operations and erase operations, and a second power domain for reading data out of the memory cells and providing an output data signal from the memory circuit. In some embodiments, the first power domain provides at least two voltages, such as 1.2 V and −1.2 V, for switching memory states of the memory cells, and the second power domain provides at least one voltage, such as VDD, for logic operations and control signals.

Advantages of the disclosed embodiments include lower bias voltages for performing memory cell operations, which avoids reliance on I/O interfaces that are compatible with larger voltage ranges and larger negative bias voltages. This reduces the area consumed and improves memory density, which lowers costs. Also, using lower bias voltages simplifies or even eliminates the use of charge pumps that were used in previous memory circuits. This also reduces the area consumed and improves memory density, which lowers cost. In addition, the positive and negative voltage power supplies can be leveraged directly for use in other functional blocks of the system, such as digital-to-analog converters (DACs), analog-to-digital converters (ADCs), operational amplifiers, and GaAs FET biasing.

FIG. 1 is a diagram schematically illustrating a memory circuit 20 that includes a control circuit 22, a memory array 24, and I/O circuits 26, in accordance with some embodiments. The memory array 24 includes memory cells 28 arranged in rows and columns. Each of the rows has a corresponding WL 30 and each of the columns has a corresponding BL 32 and a corresponding SL 34. The memory cells 28 are electrically coupled to the WLs 30, the BLs 32, and the SLs 34, such that each of the memory cells 28 is electrically coupled to one of the WLs 30, one of the BLs 32, and one of the SLs 34.

The control circuit 22 is electrically coupled to the memory array 24 by conductive paths 36 and to the I/O circuits 26 by conductive paths 38 and configured to control providing signals to the WLs 30, BLs 32, and SLs 34 based on a received memory address. The I/O circuits 26 are electrically coupled to the BLs 32 and the SLs 34 for performing read and write operations on the memory cells 28 in response to the control circuit 22 and for outputting data signals from the memory circuit 20.

The control circuit 22 is an electronic processing device that includes hardware and/or software for providing functions of the memory circuit 20. In some embodiments, the control circuit 22 includes electronic hardware and/or software for executing commands to provide functions of the memory circuit 20. In some embodiments, the control circuit 22 includes electronic hardware and/or software for executing commands provided from another computing device. In some embodiments, the control circuit 22 includes one or more processors, such as microprocessors and/or microcontrollers. In some embodiments, the control circuit 22 includes memory that stores computer code that is executed by the control circuit 22 to provide functions of the memory circuit 20.

The control circuit 22 is configured to provide signals, such as voltage signals, to the WLs 30, BLs 32, and SLs 34 for performing memory cell operations, such as reading data from the memory cells 28, outputting data from the memory circuit 20, and writing the memory cells 28 in erase operations and program operations. In some embodiments, the control circuit 22 is configured to provide a first voltage to a selected one of the WLs 30 and a second voltage to a selected one of the BLs 32 and/or to a selected one of the SLs 34 in a write operation to a selected memory cell, where the write operation can be a program operation or an erase operation. One of the first voltage or the second voltage is a positive voltage and the other one of the first voltage or the second voltage is a negative voltage. The write operation is performed on the selected memory cell while setting other WLs 30, BLs 32, and SLs 34 to 0 V. Also, the write operation is performed on a single, selected memory cell, such that the write operation is a bit-level random access write operation.

The memory circuit 20 receives power in a first power domain for performing memory cell operations, such as read and write operations that include program operations and erase operations, and a second power domain for reading data out of the memory cells and providing an output data signal from the memory circuit 20. In some embodiments, the first power domain provides at least two voltages, such as −1.2 V and 1.2 V, for switching memory states of the memory cells, and the second power domain provides at least one voltage, such as VDD, for logic operations and control signals.

In some embodiments, the memory cells 28 are ferroelectric memory cells. To perform write operations, such as program operations and erase operations, on the ferroelectric memory cells, a large voltage bias is applied across the ferroelectric material of one of the memory cells 28. The control circuit 22 is configured to distribute the large voltage bias, for performing the write operations, across the ferroelectric material by providing a positive or negative voltage on the WL and another positive or negative voltage on the BL and the SL of the selected memory cell, as described further below. This is opposed to applying one large positive or negative voltage on the WL and 0 V on the BL and SL of the selected memory cell.

FIGS. 2-5 are diagrams schematically illustrating a program operation and an erase operation in a ferroelectric memory cell 100, in accordance with some embodiments. The ferroelectric memory cell 100 includes a gate electrode 102, a drain electrode 104, a source electrode 106, channel material 108 situated adjacent and between the drain electrode 104 and the source electrode 106, and ferroelectric material 110 situated between the gate electrode 102 and the channel material 108. In some embodiments, the ferroelectric memory cell 100 is like the memory cells 28 in the memory circuit 20 of FIG. 1. In some embodiments, the control circuit 22 (shown in FIG. 1) controls application of the voltages to the ferroelectric memory cell 100.

Figure 2:
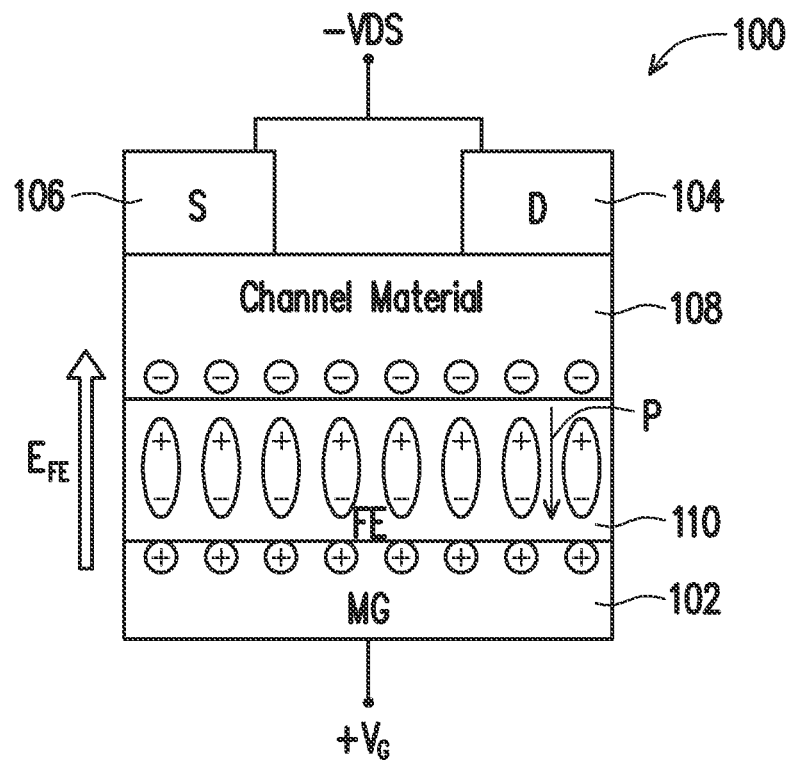
FIG. 2 is a diagram schematically illustrating a program operation of the ferroelectric memory cell, in accordance with some embodiments.

FIG. 2 is a diagram schematically illustrating a program operation of the ferroelectric memory cell 100, in accordance with some embodiments. A positive voltage +VG is applied to the gate electrode 102 and a negative voltage −VDS is applied to the drain electrode 104 and to the source electrode 106. In some embodiments, the positive voltage +VG is 1.2 V and the negative voltage −VDS is −1.2 V.

By applying the positive voltage +VG to the gate electrode 102 and the negative voltage −VDS to the drain electrode 104 and the source electrode 106, positive charges (or holes, the absence of electrons) are provided on the gate electrode 102 and electrons are provided in the channel material 108. This induces a polarity P in the ferroelectric material 110 that extends from the channel material 108 to the gate electrode 102 and an electric field E that extends from the gate electrode 102 to the channel material 108 in the ferroelectric memory cell 100. The induced polarity P in the ferroelectric material 110 and the electric field E are permanent, until changed by another operation on the memory cell 100, such as an erase operation. Also, the induced polarity P and the electric field E shift or change the operational bias of the ferroelectric memory cell 100, such that the memory cell 100 has a lower threshold value Vth1.

Figure 3:
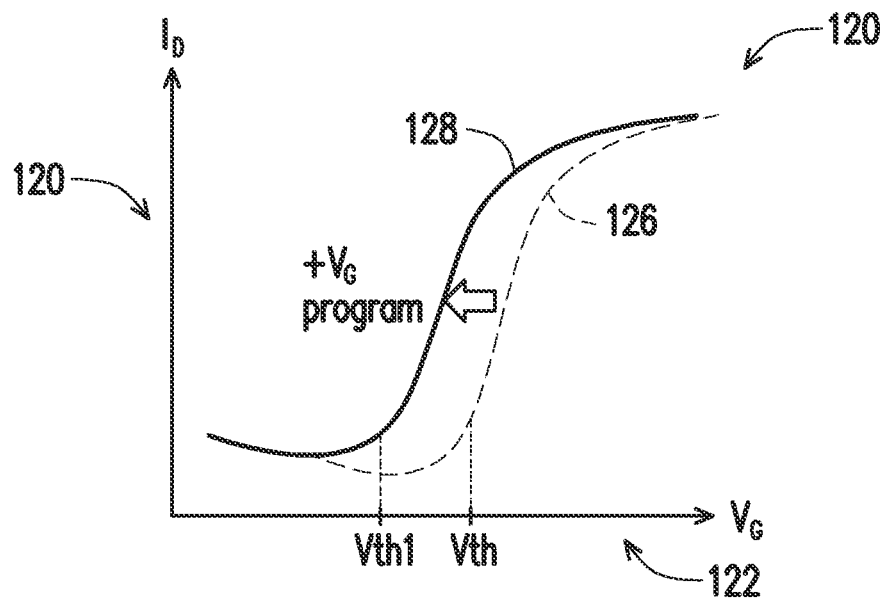
FIG. 3 is a graph schematically illustrating a shift in the operating curve of the ferroelectric memory cell due to programming the ferroelectric memory cell, in accordance with some embodiments.

FIG. 3 is a graph 120 schematically illustrating a shift in the operating curve of the ferroelectric memory cell 100 due to programming the ferroelectric memory cell 100, in accordance with some embodiments. The graph 120 has gate voltage VG on the x-axis 122 and drain current ID on the y-axis 124. The operating curve 126 of the ferroelectric memory cell 100 prior to programming is indicated in dashed lines and has a turn-on threshold voltage Vth. The operating curve 128 of the ferroelectric memory cell 100 after programming has a reduced turn-on threshold voltage Vth1.

Figure 4:
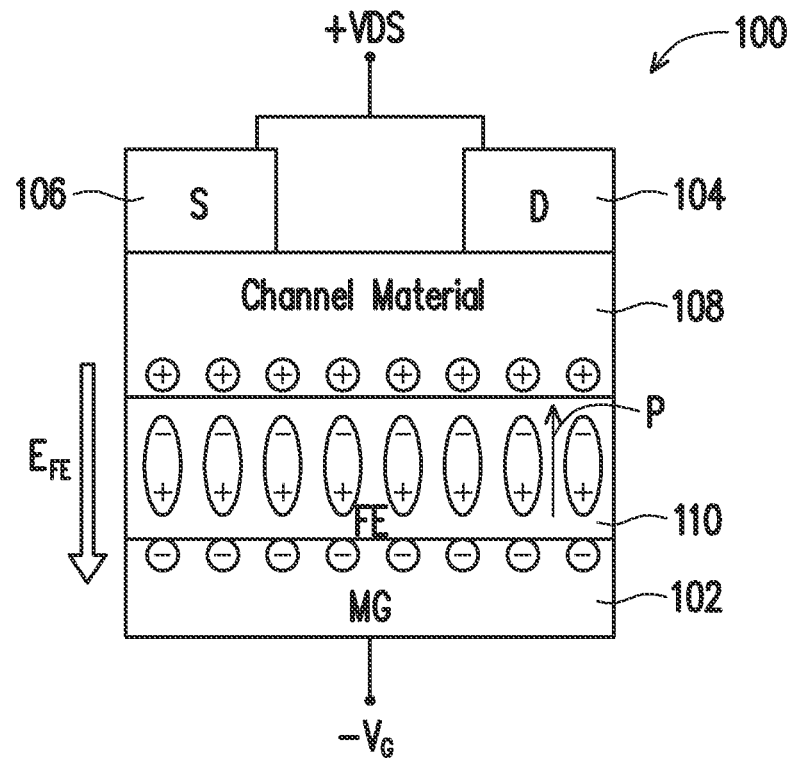
FIG. 4 is a diagram schematically illustrating an erase operation of the ferroelectric memory cell, in accordance with some embodiments.

FIG. 4 is a diagram schematically illustrating an erase operation of the ferroelectric memory cell 100, in accordance with some embodiments. A negative voltage −VG is applied to the gate electrode 102 and a positive voltage +VDS is applied to the drain electrode 104 and the source electrode 106. In some embodiments, the positive voltage +VDS is 1.2 V and the negative voltage −VG is −1.2 V.

By applying the negative voltage −VG to the gate electrode 102 and the positive voltage +VDS to the drain electrode 104 and to the source electrode 106, negative charges are provided on the gate electrode 102 and positive charges are provided in the channel material 108. This induces a polarity P in the ferroelectric material 110 that extends from the gate electrode 102 to the channel material 108 and an electric field E that extends from the channel material 108 to the gate electrode 102 in the ferroelectric memory cell 100. The induced polarity P in the ferroelectric material 110 and the electric field E are permanent, until changed by another operation on the memory cell 100, such as a program operation. Also, the induced polarity P and the electric field E shift or change the operational bias of the ferroelectric memory cell 100, such that the memory cell 100 has a higher threshold value Vth2.

Figure 5:
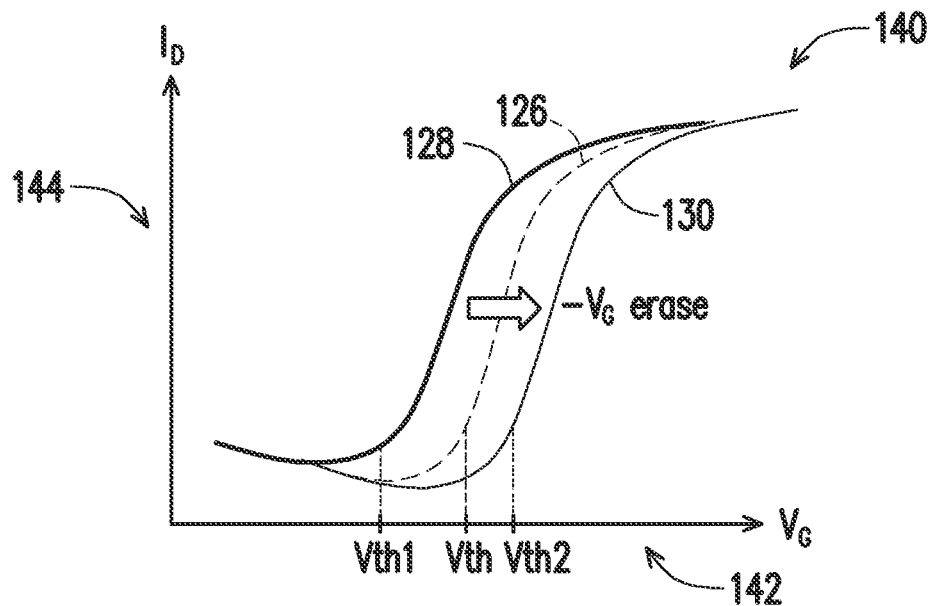
FIG. 5 is a graph schematically illustrating a shift in the operating curve of the ferroelectric memory cell due to erasing the ferroelectric memory cell, in accordance with some embodiments.

FIG. 5 is a graph 140 schematically illustrating a shift in the operating curve of the ferroelectric memory cell 100 due to erasing the ferroelectric memory cell 100, in accordance with some embodiments. The graph 140 has the gate voltage VG on the x-axis 142 and the drain current ID on the y-axis 144. The operating curve 126 of the ferroelectric memory cell 100 prior to programming or erasing is indicated in dashed lines and has a turn-on threshold voltage Vth. The operating curve 128 of the ferroelectric memory cell 100 after programming has the reduced turn-on threshold voltage Vth1. The operating curve 130 of the ferroelectric memory cell 100 after the erase operation has an increased threshold voltage Vth2. Thus, the programmed state and the erased state can be distinguished based on their threshold voltages Vth1 and Vth2.

Figure 6:
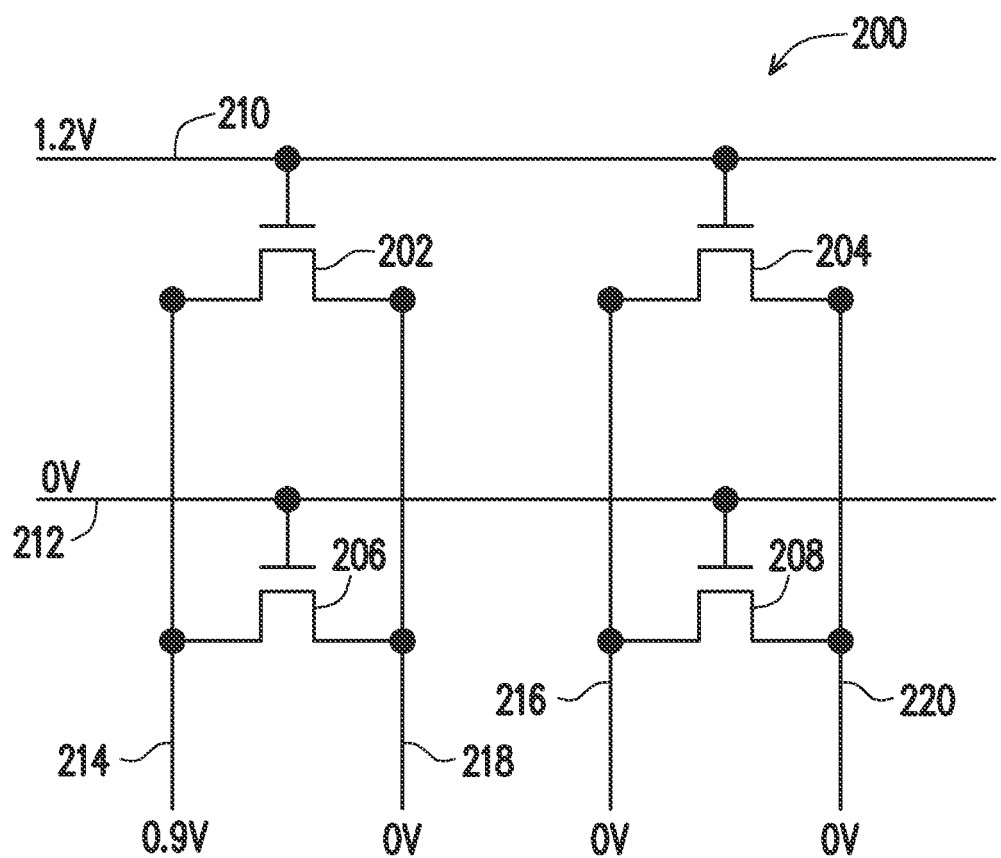
FIG. 6 is a diagram schematically illustrating a read operation of the memory cell in memory array, in accordance with some embodiments.
Figure 7:
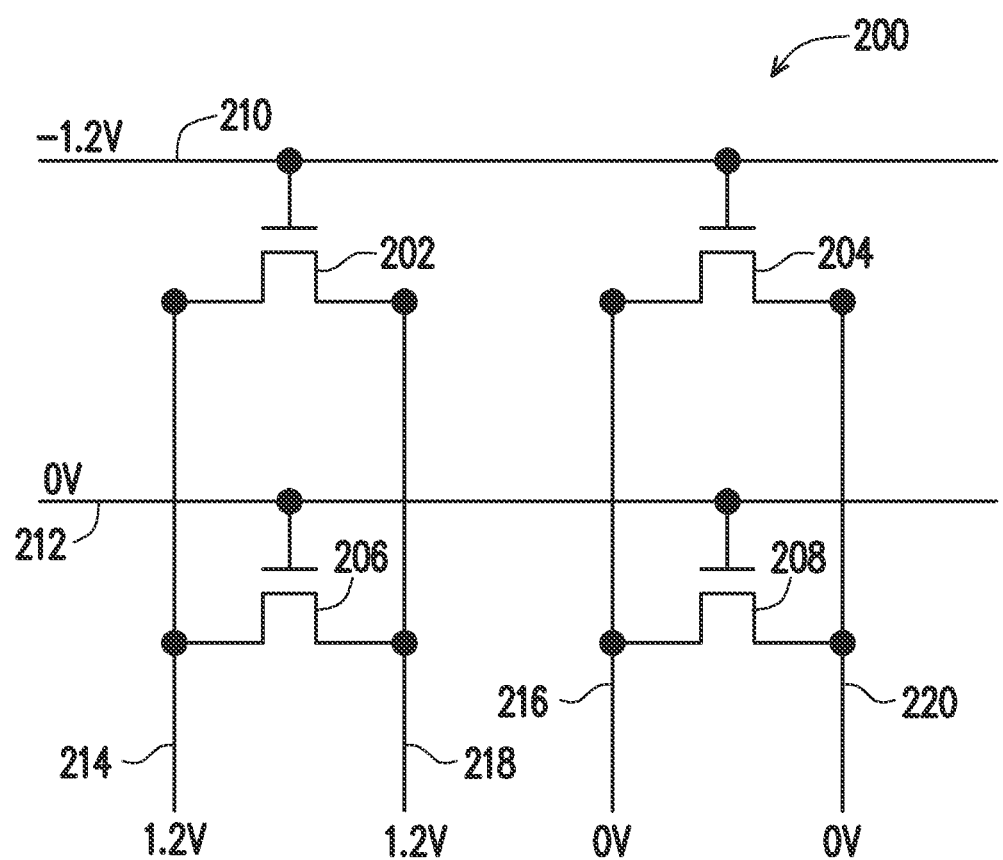
FIG. 7 is a diagram schematically illustrating an erase operation of the memory cell in the memory array, in accordance with some embodiments.
Figure 8:
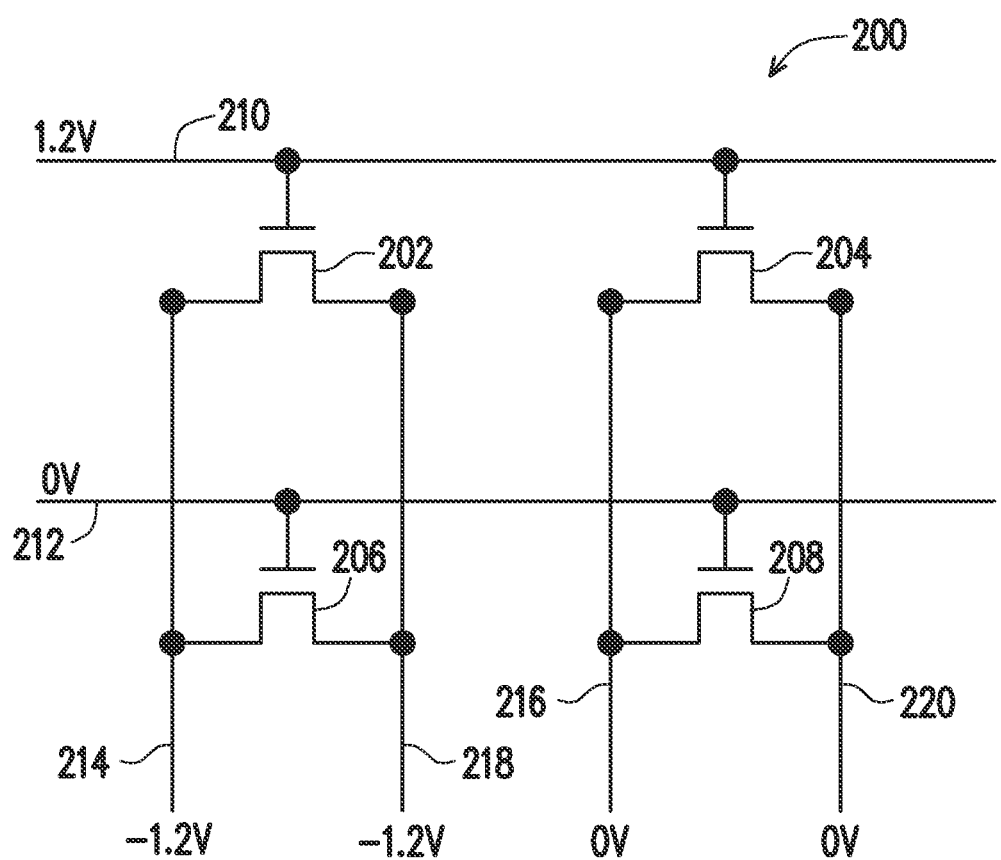
FIG. 8 is a diagram schematically illustrating a program operation of the memory cell in the memory array, in accordance with some embodiments.

FIGS. 6-8 are diagrams schematically illustrating a memory array 200 including memory cells 202, 204, 206, and 208 and illustrating a read operation, an erase operation, and a program operation on the memory cell 202, in accordance with some embodiments. In some embodiments, the memory array 200 is like the memory array 24 (shown in FIG. 1). In some embodiments, the memory array 200 is part of a memory circuit, such as the memory circuit 20 of FIG. 1.

The memory cells 202, 204, 206, and 208 are ferroelectric memory cells. In some embodiments each of the memory cells 202, 204, 206, and 208 is like the memory cell 100 described in relation to FIGS. 2-5. In some embodiments, the memory cells 202, 204, 206, and 208 are like the memory cells 28 (shown in FIG. 1).

The memory array 200 includes the memory cells 202, 204, 206, and 208, WLs 210 and 212, BLs 214 and 216, and SLs 218 and 220. Each of the memory cells 202, 204, 206, and 208 includes a gate connected to one of the WLs 210 and 212, a drain region connected to one of the BLs 214 and 216, and a source region connected to one of the SLs 218 and 220. The gate of each of the memory cells 202 and 204 is electrically connected to WL 210, and the gate of each of the memory cells 206 and 208 is electrically connected to WL 212. The drain region of each of the memory cells 202 and 206 is electrically connected to BL 214, and the drain region of each of the memory cells 204 and 208 is electrically connected to BL 216. The source region of each of the memory cells 202 and 206 is electrically connected to SL 218, and the source region of each of the memory cells 204 and 208 is electrically connected to SL 220. In some embodiments, the control circuit 22 (shown in FIG. 1) controls application of the voltages to the memory cells 202, 204, 206, and 208 through the WLs 210 and 212, BLs 214 and 216, and SLs 218 and 220.

FIG. 6 is a diagram schematically illustrating a read operation of the memory cell 202 in memory array 200, in accordance with some embodiments. A control circuit, such as control circuit 22, is configured to control the application of voltages to the WLs 210 and 212, the BLs 214 and 216, and the SLs 218 and 220.

During the read operation, the control circuit 22 provides 1.2 V to WL 210 and the gates of the memory cells 202 and 204, and 0 V to WL 212 and the gates of the memory cells 206 and 208. The control circuit 22 also provides 0.9 V to BL 214 and 0 V to BL 216 and SLs 218 and 220. The gate voltage of 0 V on the gates of the memory cells 206 and 208, turns off the memory cells 206 and 208, such that the memory cells 206 and 208 do not conduct drain current ID.

If the memory cell 202 is programmed it has the lower threshold voltage Vth1, such that the gate voltage of 1.2 V turns on the memory cell 202 to conduct drain current ID from the drain region at 0.9 V to the source region at 0 V. If the memory cell 202 is erased it has the higher threshold voltage Vth2, such that the gate voltage 1.2 V does not turn on the memory cell 202. Instead, the memory cell 202 remains off and not conducting drain current ID. Thus, the drain current ID through the memory cell 202 can be, and is, measured to determine the state of the memory cell 202.

Also, during the read operation, the memory cell 204 may be biased on or off by the gate voltage of 1.2 V, however, no drain current ID flows through the memory cell 204 since the BL 216 is at 0 V and the SL 220 is at 0 V.

FIG. 7 is a diagram schematically illustrating an erase operation of the memory cell 202 in the memory array 200, in accordance with some embodiments. The control circuit, such as control circuit 22, controls the application of the voltages to the WLs 210 and 212, the BLs 214 and 216, and the SLs 218 and 220.

During the erase operation, the control circuit 22 provides −1.2 V to WL 210 and the gates of the memory cells 202 and 204, and 0 V to WL 212 and the gates of the memory cells 206 and 208. Also, the control circuit 22 provides 1.2 V to BL 214 and SL 218 and 0 V to BL 216 and SL 220.

The gate of the memory cell 202 has −1.2 V on it and each of the drain region and the source region of the memory cell 202 has 1.2 V on it, such that the memory cell 202 has −2.4 V across the memory cell 202 and the ferroelectric material of the memory cell 202. This erases the memory cell 202, such that the threshold voltage is increased to the threshold voltage Vth2.

The gate of the memory cell 204 has −1.2 V on it and each of the drain region and the source region of the memory cell 204 has 0 V on it, such that the memory cell 204 has −1.2 V across the memory cell 204 and the ferroelectric material of the memory cell 204. This does not erase the memory cell 204, such that the state of the memory cell 204 remains the same.

The gate of the memory cell 206 has 0 V on it and each of the drain region and the source region of the memory cell 206 has 1.2 V on it, such that the memory cell 206 has −1.2 V across the memory cell 206 and the ferroelectric material of the memory cell 206. This does not erase the memory cell 206, such that the state of the memory cell 206 remains the same.

The gate of the memory cell 208 has 0 V on it and each of the drain region and the source region of the memory cell 208 has 0 V on it, such that the memory cell 208 has 0 V across the memory cell 208 and the ferroelectric material of the memory cell 208. This does not erase the memory cell 208, such that the state of the memory cell 208 remains the same.

FIG. 8 is a diagram schematically illustrating a program operation of the memory cell 202 in the memory array 200, in accordance with some embodiments. The control circuit, such as control circuit 22, controls the application of the voltages to the WLs 210 and 212, the BLs 214 and 216, and the SLs 218 and 220.

During the program operation, the control circuit 22 provides 1.2 V to WL 210 and the gates of the memory cells 202 and 204, and 0 V to WL 212 and the gates of the memory cells 206 and 208. Also, the control circuit 22 provides −1.2 V to BL 214 and SL 218 and 0 V to BL 216 and SL 220.

The gate of the memory cell 202 has 1.2 V on it and each of the drain region and the source region of the memory cell 202 has −1.2 V on it, such that the memory cell 202 has 2.4 V across the memory cell 202 and the ferroelectric material of the memory cell 202. This programs the memory cell 202, such that the threshold voltage of the memory cell 202 is reduced to threshold voltage Vth1.

The gate of the memory cell 204 has 1.2 V on it and each of the drain region and the source region of the memory cell 204 has 0 V on it, such that the memory cell 204 has 1.2 V across the memory cell 204 and the ferroelectric material of the memory cell 204. This does not program the memory cell 204, such that the state of the memory cell 204 remains the same.

The gate of the memory cell 206 has 0 V on it and each of the drain region and the source region of the memory cell 206 has −1.2 V on it, such that the memory cell 206 has 1.2 V across the memory cell 206 and the ferroelectric material of the memory cell 206. This does not program the memory cell 206, such that the state of the memory cell 206 remains the same.

The gate of the memory cell 208 has 0 V on it and each of the drain region and the source region of the memory cell 208 has 0 V on it, such that the memory cell 208 has 0 V across the memory cell 208 and the ferroelectric material of the memory cell 208. This does not program the memory cell 208, such that the state of the memory cell 208 remains the same.

Thus, embodiments disclosed herein distribute the voltage for performing write operations, such as program operations and erase operations, on the WLs, BLs, and SLs of the selected memory cell by applying part of the voltage, such as 1.2 V in a program operation and −1.2 V in an erase operation, on the WL and another part of the voltage, such as −1.2 V in a program operation and 1.2 V in an erase operation, on the BL and the SL of the selected memory cell. This is different than applying a large positive voltage, such as 2.4 V, on the WL in a program operation and a large negative voltage, such as −2.4 V, on the WL in an erase operation, with 0 V on the BL and SL of the selected memory cell. The voltage range on the WL is reduced from, for example, (−2.4 to 2.4 V) to (−1.2 to 1.2 V), which relaxes or reduces the operating requirements of the WL drivers and I/O circuits and leads to reducing the area consumed in the memory circuit for these circuits.

Also, embodiments provide that the write operations, such as the program operations and the erase operations, are performed on a single, selected memory cell, such that the write operations are bit-level random access write operations. In addition, the write operations are performed on the selected memory cell with other WLs, BLs, and SLs, such as unselected WLs, BLs, and SLs, set to 0 V. This avoids signal toggling on the unselected WLs, BLs, and SLs, improving signal latency and power consumption of the memory system.

Disclosed embodiments further provide memory circuits, such as memory circuit 20, that have power separated into a first power domain for performing memory cell operations, such as read and write operations, and a second power domain for providing output data signals and for logic operations and control signals. In some embodiments, the first power domain provides at least two voltages, such as −1.2 V and 1.2 V, and the second power domain provides at least one voltage, such as VDD, and a reference VSS, such as ground. In some embodiments, the memory circuits are designed and manufactured to have memory arrays that are three-dimensional memory arrays.

Figure 9:
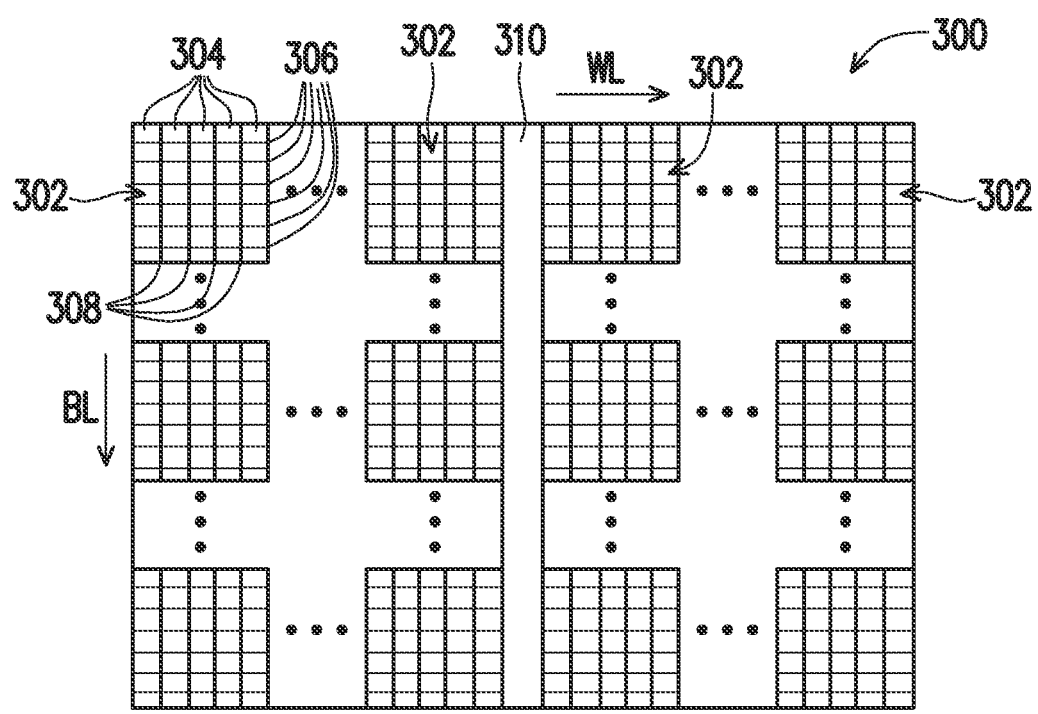
FIG. 9 is a diagram schematically illustrating a three-dimensional memory array, in accordance with some embodiments.

FIG. 9 is a diagram schematically illustrating a three-dimensional memory array 300, in accordance with some embodiments. In some embodiments, the three-dimensional memory array 300 is like the memory array 24. In some embodiments, the three-dimensional memory array 300 is like the memory array 200.

The three-dimensional memory array 300 includes subarrays 302 that include memory cells 304 arranged in rows and columns. Each of the rows has a corresponding WL 306 and each of the columns has a corresponding BL (not shown in FIG. 9) and a corresponding SL 308. The WLs extend horizontally in FIG. 9, and the BLs and SLs 308 extend vertically in FIG. 9. The memory cells 304 are electrically coupled to the WLs 306, the BLs, and the SLs 308, such that each of the memory cells 304 is electrically coupled to one of the WLs 306, one of the BLs, and one of the SLs 308. The three-dimensional array 300 further includes a global row driver 310 configured to provide voltages to the WLs 306.

Figure 10:
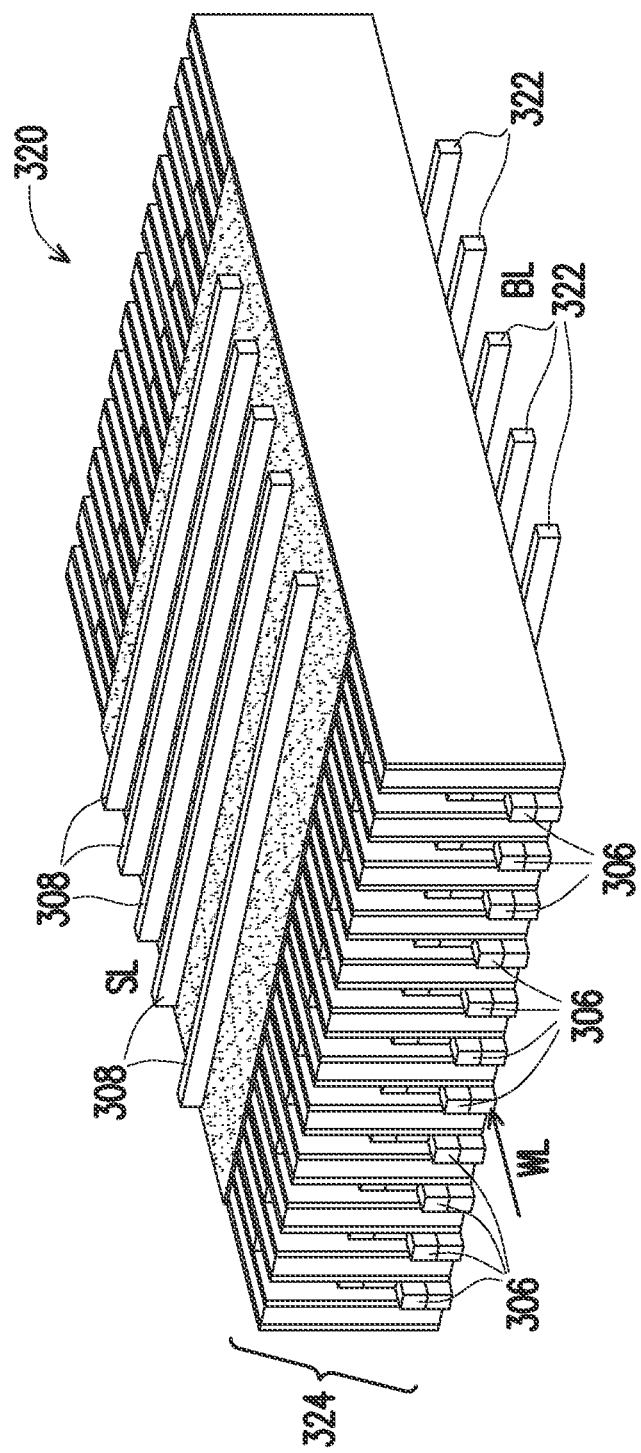
FIG. 10 is a diagram schematically illustrating a subarray that is one of the subarrays in the three-dimensional memory array, in accordance with some embodiments.

FIG. 10 is a diagram schematically illustrating a subarray 320 that is one of the subarrays 302 in the three-dimensional memory array 300, in accordance with some embodiments. The subarray 320 includes the WLs 306, the SLs 308, and BLs 322. In some embodiments, the subarray 320 includes a staircase 324 for the WLs 306 in the three-dimensional memory array 300. In some embodiments, each of the BLs 322 is a global BL and, in some embodiments, each of the SLs 308 is a global SL.

Figure 11:
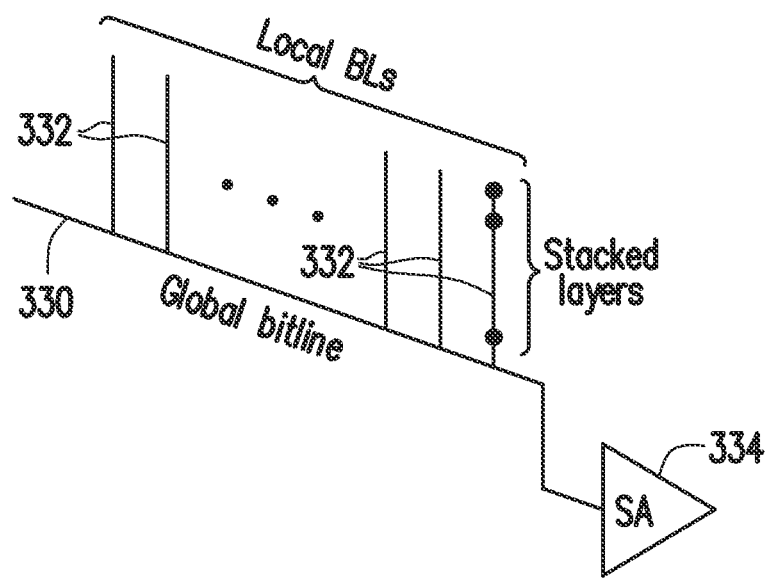
FIG. 11 is a diagram schematically illustrating a global BL that is one of the BLs, in accordance with some embodiments.

FIG. 11 is a diagram schematically illustrating a global BL 330 that is one of the BLs 322, in accordance with some embodiments. The global BL 330 includes multiple local BLs 332 that extend into the three-dimensional array 300 and are electrically connected to the memory cells 304. Each of the local BLs 332 is electrically connected to memory cells 304 in the stacked layers of the memory cells 304. The global BL 330 is electrically coupled to a sense amplifier 334 for reading data out of the memory cells 304 in read operations.

Figure 12:
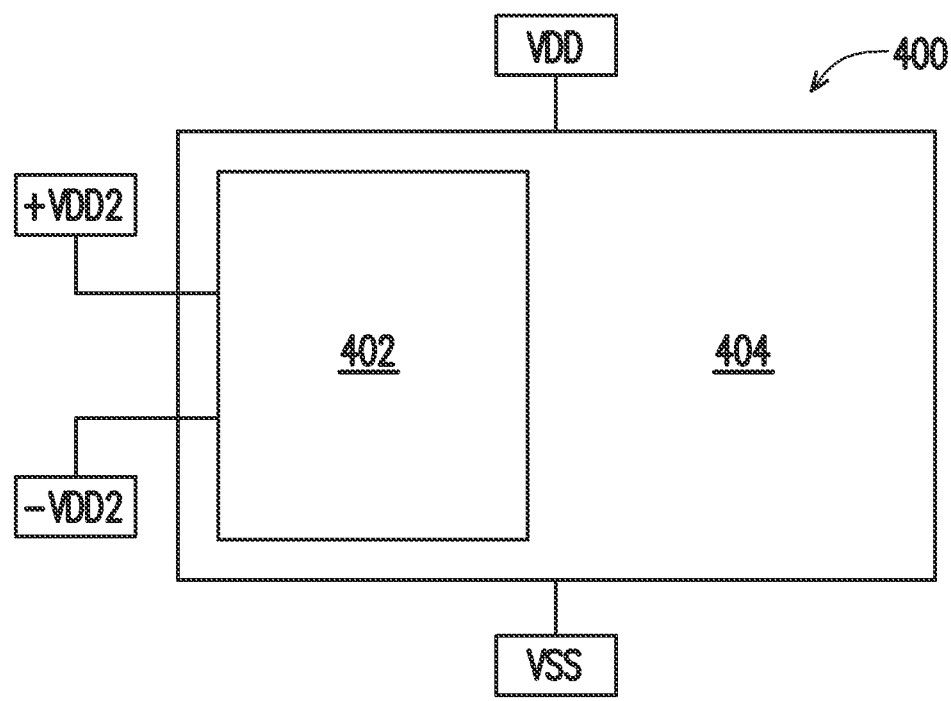
FIG. 12 is a diagram schematically illustrating a memory circuit that includes a memory array, logic and I/O circuits, and two power domains, in accordance with some embodiments.

FIG. 12 is a diagram schematically illustrating a memory circuit 400 that includes a memory array 402, logic and I/O circuits 404, and two power domains, in accordance with some embodiments. In some embodiments, the memory array 402 is like the memory array 24 (shown in FIG. 1). In some embodiments, the memory array 402 is like the memory array 200 of FIGS. 6-8. In some embodiments, the memory array 402 is like the memory array 300 of FIG. 9. In some embodiments, the memory array 402 includes ferroelectric memory cells. In some embodiments, the memory array 402 includes memory cells, such as one or more of the memory cells 28, 100, 202, 204, 206, 208, and 304.

The first power domain includes +VDD2 and −VDD2 power supplies electrically coupled to the memory array 402, and the second power domain includes a VDD power supply and a reference VSS electrically coupled to the logic and I/O circuits 404. In some embodiments, the logic and I/O circuits 404 include a control circuit, such as control circuit 22, that controls application of the +VDD2 and −VDD2 voltages to the memory array 402.

In some embodiments, the first power domain is controlled by the control circuit 22 for performing memory cell operations, such as read operations and write operations, where the write operations include program operations and erase operations. The control circuit 22 controls the application of the +VDD2 and the −VDD2 voltages to the WLs, BLs, and SLs. The first power domain is controlled by the control circuit 22 for switching memory states in the memory cells during the program operations and the erase operations. In some embodiments, the first power domain includes a +VDD2 voltage of 1.2 V and a −VDD2 voltage of −1.2 V.

The second power domain provides power to the logic and I/O circuits 404, including the control circuit 22. The second power domain is for reading data out of the memory cells and providing output data signals from the memory circuit, such as memory circuit 20, and for logic operations and control signals. In some embodiments, the second power domain includes a VDD voltage, such as 3 V or 5 V, and a reference VSS, such as ground.

Figure 13:
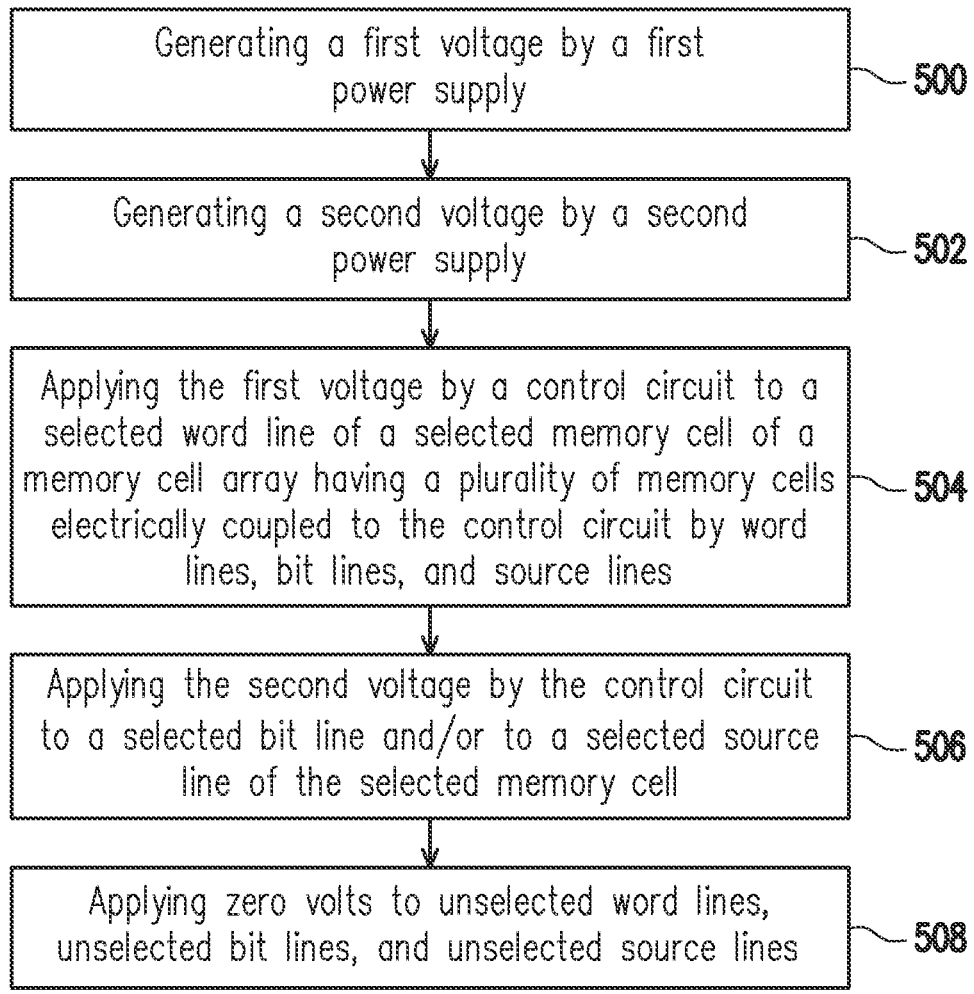
FIG. 13 is a diagram schematically illustrating a method of operating a memory device, in accordance with some embodiments.

FIG. 13 is a diagram schematically illustrating a method of operating a memory device, in accordance with some embodiments. The memory device includes a memory array that includes memory cells. In some embodiments, the memory device is like one or more of the memory circuits 20 and 400. In some embodiments, the memory array is like one or more of the memory arrays 24, 200, 300, 402. In some embodiments, the memory array includes ferroelectric memory cells. In some embodiments, the memory cells are like one or more of the memory cells 28, 100, 202, 204, 206, 208, and 304.

At 500, the method includes generating a first voltage by a first power supply, such as the +VDD2 power supply or the −VDD2 power supply and, at 502, the method includes generating a second voltage by a second power supply, such as the other one of the +VDD2 power supply and the −VDD2 power supply. In some embodiments, the method includes generating a positive voltage as one of the first voltage or the second voltage and generating a negative voltage as the other one of the first voltage or the second voltage.

At 504, the method includes applying the first voltage by a control circuit, such as control circuit 22, to a selected WL of a selected memory cell of the memory cell array that has the memory cells. Where the memory cells are electrically coupled to the control circuit by WLs, BLs, and SLs, such as WLs 30, BLs 32, and SLs 34.

At 506, the method includes applying the second voltage by the control circuit to a selected BL and/or to a selected SL of the selected memory cell. In some embodiments, applying the second voltage includes applying the second voltage by the control circuit to the selected BL and to the selected SL of the selected memory cell.

At 508, the method includes applying zero volts to unselected WLs, unselected BLs, and unselected SLs. In some embodiments, applying the first voltage and applying the second voltage in a programming operation includes applying a positive voltage as the first voltage to the selected WL and applying a negative voltage as the second voltage to the selected BL and to the selected SL. In some embodiments, applying the first voltage and applying the second voltage in an erase operation includes applying a negative voltage as the first voltage to the selected WL and applying a positive voltage as the second voltage to the selected BL and to the selected SL.

Disclosed embodiments include memory circuits that distribute the voltage bias for performing memory cell operations, such as the voltage bias across ferroelectric material, by having a positive or negative voltage on the WL and another positive or negative voltage on the BL and the SL of the selected memory cell. The voltage bias for performing memory cell operations is applied by a control circuit, such as control circuit 22, using voltage combinations on the WL, BL, and SL of the selected memory cell. This reduces the voltage range on the WL resulting in a reduction of the area consumed in the memory circuit for circuits, such as the I/O circuits. Also, disclosed embodiments use negative bias voltages for memory cell operations while maintaining interface compatibility with digital logic domain I/O circuits that operate with only positive voltages.

Disclosed embodiments further provide write operations, such as program operations and erase operations, performed on a single, selected memory cell, such that the write operations are bit-level random access write operations. In addition, the write operations are performed on the selected memory cell with other WLs, BLs, and SLs, such as unselected WLs, BLs, and SLs, set to 0 V. This avoids signal toggling on the unselected WLs, BLs, and SLs, improving signal latency and power consumption of the memory system.

Disclosed embodiments further provide memory circuits, such as memory circuits 20 and 400, that have power separated into a first power domain for performing memory cell operations, such as read and write operations, and a second power domain for providing output data signals and for logic operations and control signals. In some embodiments, the memory circuits are designed and manufactured to have memory arrays that are three-dimensional memory arrays.

Advantages of the disclosed embodiments include lower bias voltages for performing memory cell operations, which avoids reliance on I/O interfaces that are compatible with larger voltage ranges and larger negative bias voltages and simplifies or even eliminates the use of charge pumps used in previous memory circuits. This reduces the area consumed, improves memory density, and lowers cost. In addition, the positive and negative voltage power supplies can be leveraged directly for use in other functional blocks of the system, such as DACs, ADCs, operational amplifiers, and GaAs FET biasing.

In accordance with some embodiments, a memory system includes a plurality of memory cells, a plurality of word lines, a plurality of bit lines, and a plurality of source lines. The plurality of memory cells are arranged in rows and columns, each of the plurality of memory cells having a gate, a drain, and a source. In the plurality of word lines, each of the word lines having a corresponding row, wherein each of the word lines is coupled to the gates of the memory cells in the corresponding row. In the plurality of bit lines and the plurality of source lines, each of the bit lines and each of the source lines having a corresponding column, where each of the bit lines is connected to the drain of the memory cells in the corresponding column and each of the source lines is connected to the source of the memory cells in the corresponding column. Where, in a write operation, the word line corresponding to a selected memory cell is configured to receive a first voltage, and the bit line and the source line of the selected memory cell are configured to receive a second voltage, and where one of the first voltage or the second voltage is a positive voltage and the other of the first voltage or the second voltage is a negative voltage.

In accordance with further embodiments, a memory device includes a plurality of memory cells, at least two power supplies in a first power domain, at least one power supply in a second power domain, and a control circuit. The at least two power supplies in the first power domain are configured to provide a first voltage and a second voltage for switching states of memory cells in the plurality of memory cells. The at least one power supply in the second power domain is configured to provide a third voltage for logic operations and data signaling. The control circuit is configured to provide the first voltage and the second voltage to the plurality of memory cells for switching the states of the memory cells in the plurality of memory cells.

In accordance with still further disclosed aspects, a method of operating a memory device includes: generating a first voltage by a first power supply; generating a second voltage by a second power supply; applying the first voltage by a control circuit to a selected word line of a selected memory cell of a memory cell array having a plurality of memory cells electrically coupled to the control circuit by word lines, bit lines, and source lines; applying the second voltage by the control circuit to a selected bit line and/or to a selected source line of the selected memory cell; and applying zero volts to unselected word lines, unselected bit lines, and unselected source lines.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory system, comprising:
   a plurality of memory cells arranged in rows and columns, each of the plurality of memory cells having a gate, a drain, a source, channel material situated adjacent the drain and the source, and ferroelectric material situated between the gate and the channel material;
   a plurality of word lines, each of the word lines having a corresponding row, wherein each of the word lines is coupled to the gates of the memory cells in the corresponding row;

a plurality of bit lines and a plurality of source lines, each of the bit lines and each of the source lines having a corresponding column, wherein each of the bit lines is connected to the drain of the memory cells in the corresponding column and each of the source lines is connected to the source of the memory cells in the corresponding column;

wherein in a write operation, a first word line corresponding to a selected memory cell is configured to receive a first voltage, and a first bit line and a first source line of the selected memory cell are configured to receive a second voltage, and a second word line corresponding to an unselected memory cell is configured to receive a ground reference voltage, and a second bit line and a second source line of the unselected memory cell are configured to receive the second voltage; and wherein one of the first voltage or the second voltage is a positive voltage and the other of the first voltage or the second voltage is a negative voltage.

2. The memory system of claim 1, wherein in the write operation an unselected word line, an unselected bit line, and an unselected source line are configured to receive zero volts.

3. The memory system of claim 1, comprising a control circuit electrically coupled to the plurality of memory cells through the plurality of word lines, the plurality of bit lines, and the plurality of source lines, the control circuit configured to provide the first voltage to the word line corresponding to the selected memory cell and the second voltage to the bit line and the source line of the selected memory cell.

4. The memory system of claim 1, wherein the write operation to the selected memory cell includes a program operation or an erase operation.

5. The memory system of claim 1, wherein the write operation to the selected memory cell is a program operation and the word line corresponding to the selected memory cell is configured to receive the positive voltage as the first voltage and the bit line and the source line of the selected memory cell are configured to receive the negative voltage as the second voltage.

6. The memory system of claim 1, wherein the write operation to the selected memory cell is an erase operation and the word line corresponding to the selected memory cell is configured to receive the negative voltage as the first voltage and the bit line and the source line of the selected memory cell are configured to receive the positive voltage as the second voltage.

7. The memory system of claim 1, wherein, in a read operation of the selected memory cell, the word line corresponding to the selected memory cell is configured to receive the positive voltage as the first voltage, the bit line of the selected memory cell is configured to receive a third voltage, and the source line of the selected memory cell is configured to receive zero volts.

8. The memory system of claim 1, comprising a first power domain that includes the first voltage and the second voltage for biasing the word lines and for biasing the bit lines and the source lines in the write operation of the selected memory cell.

9. The memory system of claim 8, comprising a second power domain that includes a power supply voltage for providing power for logic operations and data signaling.

10. A memory system, comprising:
a plurality of memory cells arranged in rows and columns, each of the plurality of memory cells having a gate, a drain, a source, channel material situated adjacent the drain and the source, and ferroelectric material situated between the gate and the channel material;
a plurality of word lines, each of the word lines having a corresponding row, wherein each of the word lines is coupled to the gates of the memory cells in the corresponding row;
a plurality of bit lines and a plurality of source lines, each of the bit lines and each of the source lines having a corresponding column, wherein each of the bit lines is connected to the drain of the memory cells in the corresponding column and each of the source lines is connected to the source of the memory cells in the corresponding column;
wherein in a program operation, a first word line connected to a selected memory cell is configured to receive a positive voltage and a second word line connected to a first unselected memory cell is configured to receive a ground voltage, and a first bit line and a first source line of the selected memory cell and of the first unselected memory cell are configured to receive a negative voltage.

11. The memory system of claim 10, wherein the first word line is connected to a second unselected memory cell, and a second bit line and a second source line are connected to the second unselected memory cell and configured to receive the ground reference.

12. The memory system of claim 11, wherein the second word line is connected to a third unselected memory cell, and the second bit line and the second source line are connected to the third unselected memory cell and configured to receive the ground reference.

13. The memory system of claim 10, wherein, in a read operation of the selected memory cell, the first word line corresponding to the selected memory cell is configured to receive the positive voltage, the bit line of the selected memory cell is configured to receive a bit line positive voltage, and the source line of the selected memory cell is configured to receive the ground reference.

14. The memory system of claim 10, comprising a first power domain that includes the positive voltage and the negative voltage for biasing the word lines and for biasing the bit lines and the source lines in the program operation of the selected memory cell.

15. The memory system of claim 14, comprising a second power domain that includes a power supply voltage VDD for providing power for logic operations and data signaling.

16. A memory system, comprising:
a plurality of memory cells arranged in rows and columns, each of the plurality of memory cells having a gate, a drain, a source, channel material situated adjacent the drain and the source, and ferroelectric material situated between the gate and the channel material;
a plurality of word lines, each of the word lines having a corresponding row, wherein each of the word lines is coupled to the gates of the memory cells in the corresponding row;
a plurality of bit lines and a plurality of source lines, each of the bit lines and each of the source lines having a corresponding column, wherein each of the bit lines is connected to the drain of the memory cells in the corresponding column and each of the source lines is connected to the source of the memory cells in the corresponding column;
wherein in an erase operation, a first word line connected to a selected memory cell is configured to receive a negative voltage and a second word line connected to a first unselected memory cell is configured to receive a ground voltage, and a first bit line and a first source line of the selected memory cell and of the first unselected memory cell are configured to receive a positive voltage.

17. The memory system of claim 16, wherein the first word line is connected to a second unselected memory cell, and a second bit line and a second source line are connected to the second unselected memory cell and configured to receive the ground reference.

18. The memory system of claim 17, wherein the second word line is connected to a third unselected memory cell, and the second bit line and the second source line are connected to the third unselected memory cell and configured to receive the ground reference.

19. The memory system of claim 16, wherein, in a read operation of the selected memory cell, the first word line corresponding to the selected memory cell is configured to receive the positive voltage, the bit line of the selected memory cell is configured to receive a bit line positive voltage, and the source line of the selected memory cell is configured to receive the ground reference.

20. The memory system of claim 16, comprising a first power domain that includes the positive voltage and the negative voltage for biasing the word lines and for biasing the bit lines and the source lines in the erase operation of the selected memory cell, and a second power domain that includes a power supply voltage VDD for providing power for logic operations and data signaling.

\* \* \* \* \*